United States Patent [19]
Ruile et al.

[11] Patent Number: 5,621,364
[45] Date of Patent: Apr. 15, 1997

[54] WEIGHTED REFLECTOR FOR SURFACE ACOUSTIC WAVES

[75] Inventors: Werner Ruile; Jürgen Machui; Roland Dill, all of München; Brian Lewis, Brackley, all of Germany

[73] Assignee: Siemens Aktiengesellschaft, Munich, Germany

[21] Appl. No.: 325,410

[22] PCT Filed: Apr. 15, 1993

[86] PCT No.: PCT/DE93/00335

§ 371 Date: Oct. 27, 1994

§ 102(e) Date: Oct. 27, 1994

[87] PCT Pub. No.: WO93/22831

PCT Pub. Date: Nov. 11, 1993

[30] Foreign Application Priority Data

Apr. 27, 1992 [DE] Germany .................. 41 13 800.0

[51] Int. Cl.⁶ .................................................. H03H 9/145
[52] U.S. Cl. .................... 333/195; 333/196; 310/313 C; 310/313 D
[58] Field of Search ...................... 333/193, 194, 333/195, 196; 310/313 R, 313 B, 313 C, 313 D

[56] References Cited

U.S. PATENT DOCUMENTS

| 3,978,437 | 8/1976 | Paige | 333/72 |
| 4,618,841 | 10/1986 | Riha | 333/195 |
| 4,760,360 | 7/1988 | Grassi et al. | 333/195 |
| 4,801,836 | 1/1989 | Mariani | 310/313 D |

FOREIGN PATENT DOCUMENTS

| 0026114 | 4/1981 | European Pat. Off. |
| 24927 | 3/1981 | Japan . |
| 128519 | 5/1991 | Japan . |

OTHER PUBLICATIONS

M. Takeuchi et al., "New Types of Saw Reflectors and Resonators Consisting of Reflecting Elements With Positive and Negative Reflection Coefficients", IEEE Transactions on Ultrasonics, Ferroelectrics and Frequency Control, No. 4, Jul. 1986, pp. 369–374.

Primary Examiner—Benny Lee
Assistant Examiner—David H. Vu
Attorney, Agent, or Firm—Hill, Steadman & Simpson

[57] ABSTRACT

A weighted reflector which has relatively low sensitivity to production-dependent tolerances. The reflector is based on the principle of an open-short reflector which has length-weighted reflector strips.

4 Claims, 3 Drawing Sheets

WEIGHTED REFLECTOR FOR SURFACE ACOUSTIC WAVES

BACKGROUND OF THE INVENTION

1. Field of the Invention

The present invention relates to a weighted surface-wave reflector and, in particular, to a surface wave reflector having metallization strips connected to busbars and other metallization strips not connected to the busbars.

2. Description of the Related Art

Surface-wave arrangements are known which, in addition to at least one interdigital transducer on a piezoelectric substrate, also have at least one reflector for the acoustic wave which is produced electrically in this transducer. This acoustic wave runs in the surface or in the substrate close to the surface of this substrate and is reflected in the reflector, the reflection being a 180° backward reflection in the case of in-line arrangements. Such a reflector comprises, as is known, a large number of strips or fingers which are arranged parallel to one another.

In individual cases, reflectors are required which have a very narrow bandwidth and high selectivity. Such reflectors primarily comprise a very large number of strips which are arranged at a distance from one another, matched to the center frequency. However, surface-wave arrangements having reflectors with a wider bandwidth are also required. This can be achieved with a relatively small number of strips, but with a lower overall reflection capability. Reflectors having a dispersive characteristic are also known.

As a rule, a common feature of all such arrangements is that their characteristics can be disturbed or corrupted by production-dependent scatter or variance, to be precise even if this scatter or variance, for example the center separations, the specified dimensions of width and thickness of the strips and the like, are very small specifically because surface-wave elements are very high precision electronic components.

Surface-wave arrangements having reflectors are used, for example, as resonators. One example of such a resonator is known from European Patent Application 0 257 377, as is illustrated in FIG. 1. A reflector 3 and 4 is located on each of the two sides of the at least one transducer 6, which is located in the center on the surface of the substrate 2.

A particular type of reflector, a so-called "open-short reflector" is known from IEEE Trans. on Ultrasonics Ferroelectrics and Frequency Control, Vol. UFFC -33, No. 4 (1986) pages 369–374. This reflector has strips where the center separation of adjacent strips from one another is one quarter of the wavelength of the acoustic wave. Such a dimension is familiar from split-finger transducers and, based on this, the reflector is also called a "split-finger reflector". The individual strips (frequently also called fingers) are alternately on the one hand metal strips which are short-circuited to one another by busbars and on the other hand electrically "open" strips in the sequence of their side-by-side arrangement (in the x-direction of the main wave propagation). FIG. 2 shows the basic principle of an open-short reflector. Those busbars which electrically connect the metal strips 22 to one another are designated by 21. Between the strips 22, there are strips 23 which are electrically insulated from the strips 22 and from one another. The connection type, open or short-circuited, of the strips 22 and 23 alternates, as can be seen.

As in the case of a split-finger transducer, the mechanical reflections cancel one another out in the case of the open-short reflector in FIG. 2 as well. In contrast, the electrical reflections are amplified because of the alternating connection sequence of the strips 22. This electrical reflection which still occurs is governed essentially by the coupling factor of the material of the substrate, which is a material characteristic.

If a substrate material such as lithium niobate, for example, is used which has a high coupling factor, then an open-short reflector according to FIG. 2 has a high reflection level and a reflector constructed from such groups has a wide bandwidth.

It is unnecessary for the width dimensions of the strips 22 and 23, namely those of the strips 22 which are short-circuited to one another and those of the "open" strips 23, to be of equal size. However, conformity of the quarter-lambda periodicity of the arrangement of the strips 22 is important.

Furthermore, from European Patent Application 0 026 114, it is generally known for surface-wave reflectors to be given a weighting function.

SUMMARY OF THE INVENTION

An object of the present invention is to specify a weighted surface-wave reflector, by means of which a transfer function which can be specified and is as insensitive as possible to production-dependent tolerances relating to the width and the thickness of the metal strips required for this purpose is achieved.

These and other objects and advantages are achieved in a surface-wave reflector of the type mentioned initially according to the invention by having metallization strips which are arranged parallel to one another and having at least one busbar. The metallization strips include some which are connected via the busbar and open metallization strips which are not connect to the busbar. The open metallization strips vary in their length in accordance with a predetermined weighting function. Further metallization strips are provided which are connected to the busbar or busbars are arranged in the free spaces between the open metallization strips and the busbar or busbars.

In another embodiment, a weighted surface-wave reflector is provided having metallization strips which are arranged parallel to one another and two busbars, the metallization strips including strips which are connected via the busbars and open metallization strips which are not connected to the busbars. The connected metallization strips are interrupted in their longitudinal direction, the length of the interruption being determined by a predetermined weighting function. An insulated metallization strip is provided in the interruptions.

Such a weighted reflector structure can also be a component of a surface transducer.

The present invention is based on the idea of using an open-short reflector and of giving this reflector a weighting function which may comprise zero points and/or even points of phase reversal, to be precise irrespective of whether these weighting functions are continuous or have discontinuities.

Using such a surface-wave structure, a filter function which can be specified can be implemented, the open-short reflector of the invention being weighted as designed.

It has been found that an open-short reflector as has been described above is relatively insensitive, with respect to its reflection behavior, to manufacturing tolerances relating to the strip width and the layer thickness and that this invariance is also maintained when such a reflector is weighted.

DETAILED DESCRIPTION OF THE PREFERRED EMBODIMENTS

Figure 1:
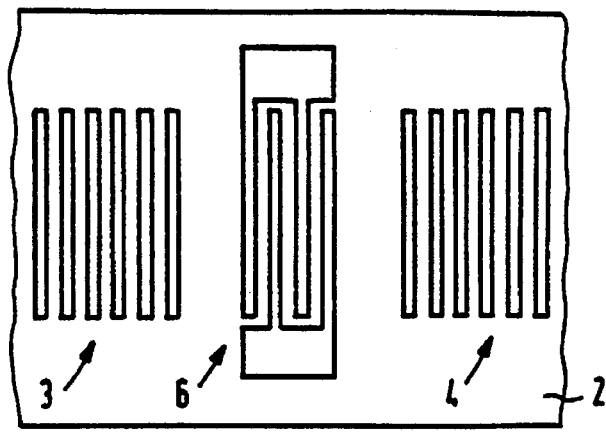
FIG. 1 is a plan view of a prior art surface resonator.
Figure 2:
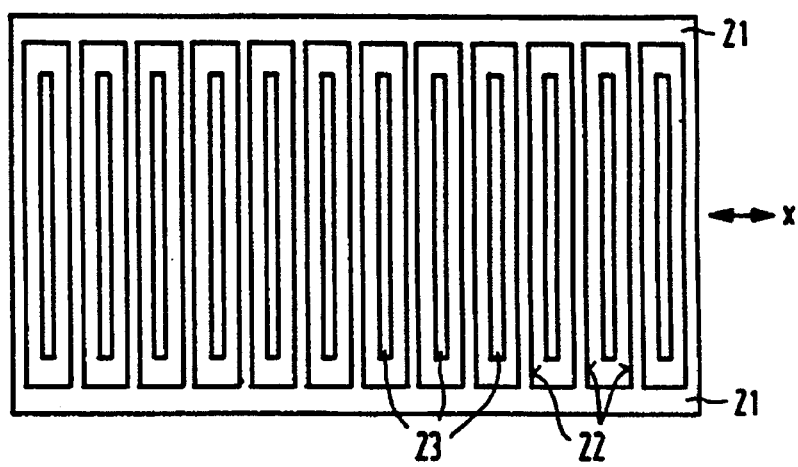
FIG. 2 is a plan view of an open-short reflector for use in describing the principles of the present invention.

A weighting principle, which is used according to the invention, for such a reflector is strip omission weighting in which, wherever no reflection is intended to occur in the reflector in the case of the design corresponding to the predetermined filter function, either a respective "open" strip of the sequence of strips 23 is connected to the busbars 22 such that it is now a short-circuited strip 22, or in which a strip which is short-circuited in the reflector in FIG. 2 to the busbars is separated from these busbars and makes it into an "open" strip. In both cases, not only do the mechanical reflections continue to cancel one another out at such a location in each case, but also the electrical reflections. The further explanation is continued in detail with reference to the first embodiment described here.

Figure 3:
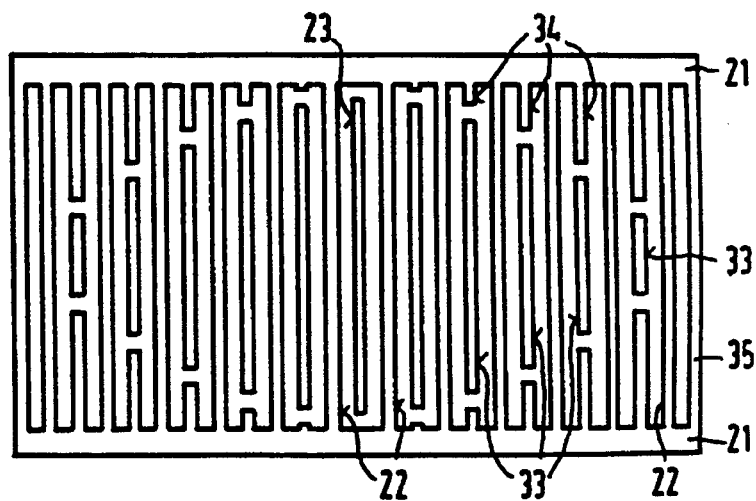
FIG. 3 is a plan view of an aperture weighted surface wave reflector according to the present invention.

As a development, the invention also comprises the option for continuous aperture weighting of the strips or of the reflector. For this purpose, only length elements of individual "open" strips are connected to the busbars and thus become short-circuited strip elements. FIG. 3 shows an outline diagram of such an aperture weighting which is used in the case of the invention. The short-circuited strips are also designated by 22 in FIG. 3. Weighted open fingers of the reflector are designated by 33 in FIG. 3. As can easily be seen from the figure, these fingers 33 have different lengths, namely corresponding to the known aperture weighting. However, there are also strip elements 34 in the longitudinal direction of these strips 33, which strip elements 34 are strip parts which are cut off the strips 33 and are connected to the busbars 21. Two strips 35 at the ends, which are located at a location of an otherwise open strip, are weighted to "zero", however, i.e. the end strips are entirely short-circuited strips. That strip 33 which is located in the center in the arrangement is a completely unweighted open strip, as exists exclusively as an open strip 23 in the arrangement in FIG. 2.

Figure 4:
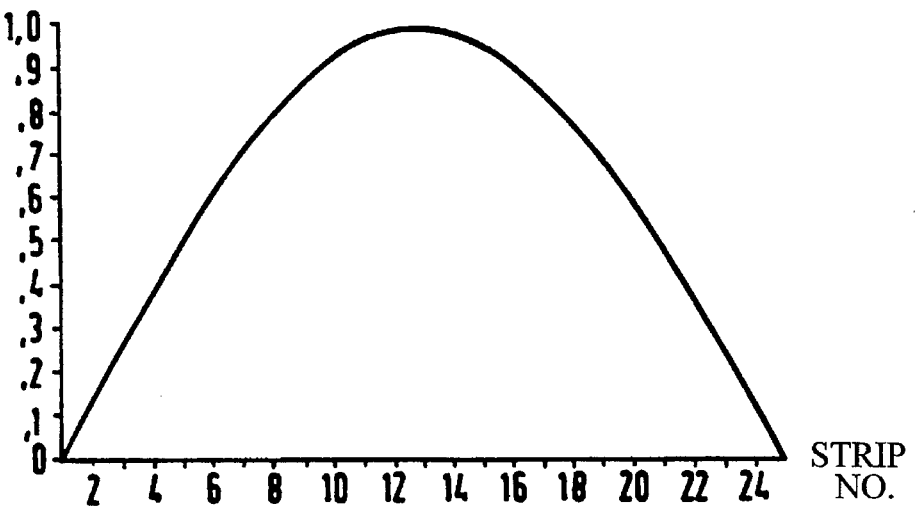
FIG. 4 is a graph of the reflection capacity of strips in the reflector of FIG. 3.

FIG. 4 shows the extent of the reflection capacity at the location of a respective strip of the reflector according to FIG. 3, entered above the strip "number" on the ordinate. In other words, this is the weighting function. Specifically, to a first approximation, the strength of the reflection is directly proportional to the "open" length of the respective open strip.

Figure 5:
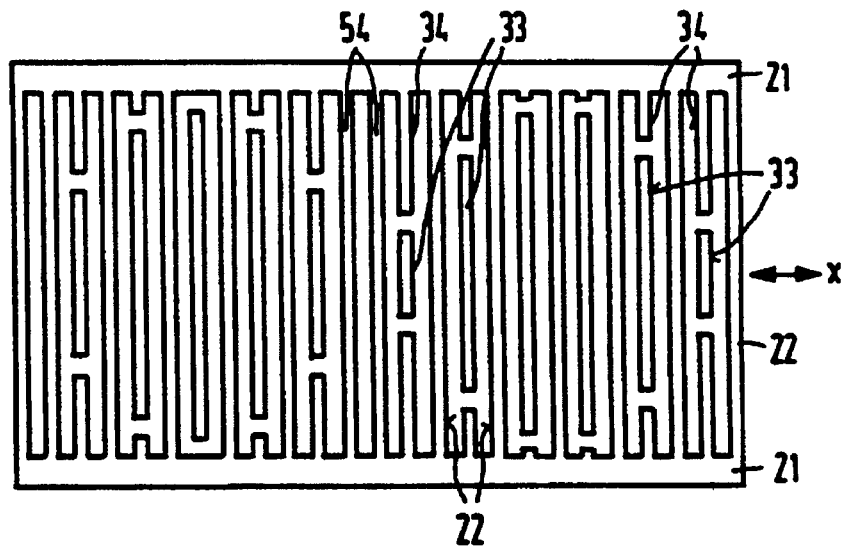
FIG. 5 is a plan view of a weighted reflector having two weightings.

FIG. 5 shows an application of the principle of FIG. 3, but contained twice in this reflector in FIG. 5. Details in FIG. 5 whose meaning and function correspond with those in FIG. 3 are designated by the same reference symbols as in FIG. 3 and also have the meaning described in relation to FIG. 3.

The two strips 54 in the center of the reflector must be noted in particular in the case of the arrangement in FIG. 5. These are those strips which have intrinsically and individually taken on the characteristics of open strips 34 and 35 respectively in FIG. 3 with "zero" weighting. However, since the strips 54 are located side by side with a center separation of a quarter lambda, they produce a change in the mathematical sign of the reflection and thus represent a I-base change. The otherwise alternating arrangement of (unweighted) short-circuited strips and of (weighted) open strips (the latter also including strips with "zero" weighting like the strips 35) is interrupted at the point of the strips 54.

FIG. 5 shows that even very highly complicated (continuous) weighting functions can be implemented using the invention.

Figure 6:
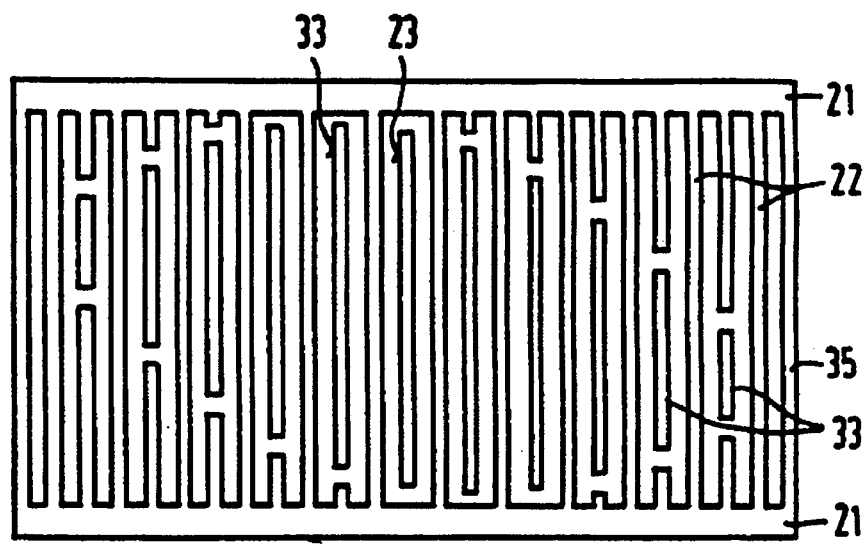
FIG. 6 is a plan view of an alternate placement of the strips of the weighted reflector.

FIG. 6 shows that any desired placing of the open strips in the available aperture is also possible. The arrangement in FIG. 6 corresponds essentially to that in FIG. 3 but, as can be seen, the centroids of the electrical reflection are displaced over the reflector in the transverse direction with respect to the reflector, that is to say in the direction of the vertical in FIG. 6.

Yet another embodiment of the invention consists in that the open strips can also be interrupted a plurality of times as has already been described, for example, in another context in European Application 0 124 019. This measure allows multistrip coupler effects to be avoided. For this purpose (in addition), the short-circuited strips 22 can also be interrupted, but only once each, however, to the extent that the busbars 21 are connected to one another. FIG. 6 additionally shows such interruptions.

If an interruption, as described above in the short-circuited strips is also described with, it is sufficient to provide only one of the busbars 21 provided in the case of the designs illustrated, since one of the busbars already ensures that the strips 22 are short-circuited to one another.

In the known open-short reflector, The reflector strips are in pair wherein one metallization strip is a short-circuited "short" strip and the other strip is an "open" strip. The latter can assume any desired floating potential in the surface-wave structure, while in contrast the short-circuited strip is always at the potential of the busbar to which this strip is electrically connected. The invention also includes "pairs", but these pairs are not necessarily the same as the "pairs" of the known reflector. A large number of design possibilities in which a short-circuited strip and an adjacent open strip can be changed according to the invention are thus provided, as follows:

1. One strip is a short-circuited strip and an adjacent strip has one part which is an open strip and has one or more remaining parts which are electrically connected to one or both busbars. This strip is thus a length-weighted open strip.
2. A special case of example 1 is where the second strip is a short-circuited strip, with "zero" weighting, over its entire length and thus it is not structurally distinguished from the electrically connected strip to which it is adjacent.
3. The second strip remains an unchanged open strip and the adjacent first strip is divided such that a part of this first strip becomes an open strip. This requires at least two interruptions in the case of busbars 21 being provided on two sides.
4. A special case of example 3 is where the strip a is divided to form a strip with "zero" weighting, like the second strip.

A phase change (see FIG. 5, strips 54) is in this case represented as if a short-circuited finger were additionally inserted into the structure. The structure thus has two adjacent short-circuited strips at a point of the phase change. An additional strip can also be inserted instead of or as a phase change in the periodicity.

Figure 7:
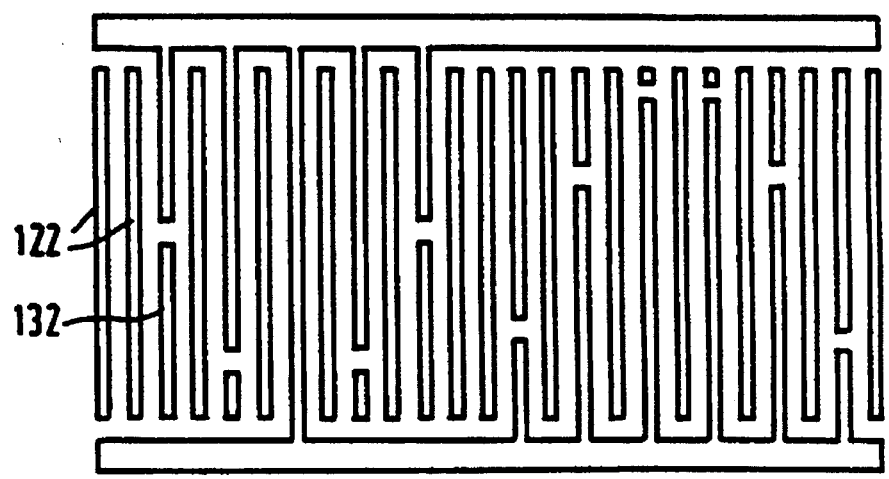
FIG. 7 is a plan view of another embodiment of the weighted reflector.

FIGS. 3, 5 and 6 show examples of how the short-circuited and the open metallization strips of the weighted reflector are distributed and the open fingers are length-weighted. The reflector which is the inverse of this implements the same transfer function, in the case of which reflector—as FIG. 7 shows in comparison with 5—all the short-circuited strips are interchanged with all the open, possibly weighted strips. The two first (short-circuited) strips from the left of the reflector in FIG. 5 are open strips 122 in the reflector in FIG. 7, to be precise being unweighted. The third strip from the left in FIG. 5, which is a weighted open strip there, is a short-circuited strip, which is, however, weighted by an open length element 132, in the case of the reflector in FIG. 7. In the case of the inverse structure, the open fingers are unweighted and the weighting is carried out on the metallization strips, which are the short-circuited strips in the structure according to FIG. 5. These weighted metallization strips then have length elements which are open (not connected to any busbar) corresponding to the weighting and can additionally also still be further interrupted (in order to avoid split-finger effects). For this reason, even the unweighted, open strips which are present in such an "inverse" reflector may have additional interruptions.

Although other modifications and changes may be suggested by those skilled in the art, it is the intention of the inventors to embody within the patent warranted hereon all changes and modifications as reasonably and properly come within the scope of their contribution to the art.

We claim:

1. A weighted surface-wave reflector, comprising:
   metallization strips which are arranged parallel to one another;
   at least one busbar,
   said metallization strips including:
      first metallization strips which are connected to one another via said at least one busbar and
      open metallization strips which are free of said at least one busbar, said open metallization strips vary in length in accordance with a predetermined weighting function, and
      said first metallization strips being in free spaces between said open metallization strips.

2. A weighted surface-wave reflector as claimed in claim 1, wherein said at least one busbar includes first and second busbars, said first metallization strips are connected between said first and second busbars.

3. A weighted surface-wave reflector, comprising:
   metallization strips which are arranged parallel to one another;
   two busbars,
   said metallization strips including:
      connected metallization strips which are connected to one another via said two busbars and
      open metallization strips which are free of said two busbars,
      said connected metallization strips are interrupted in a longitudinal direction, a length of an interruption is determined by a predetermined weighting function, and
      said open metallization strips being provided in the interruptions.

4. A weighted surface-wave reflector as claimed in claim 3, further comprising:
   short-circuited metallization strips parallel to and in alternation between each of said connected metallization strips, said short-circuited metallization strips being connected between said two busbars.

* * * * *